United States Patent [19]

Serizawa

[11] Patent Number: 5,684,329
[45] Date of Patent: Nov. 4, 1997

[54] LEAD FRAME FOR SEMICONDUCTOR DEVICE

[76] Inventor: Seiichi Serizawa, 64-6, Higashi-Omiya 6-Chome, Omiya-Shi, Saitama-Ken, Japan

[21] Appl. No.: 717,063

[22] Filed: Sep. 20, 1996

[30] Foreign Application Priority Data

Apr. 2, 1996 [JP] Japan .................................. 8-104594

[51] Int. Cl.$^6$ .................................. H01L 23/495
[52] U.S. Cl. .................. 257/677; 257/666; 428/620; 428/628
[58] Field of Search ...................... 257/666, 677

[56] References Cited

U.S. PATENT DOCUMENTS

| | | | |
|---|---|---|---|
| 4,929,516 | 5/1990 | Pryor et al. | 428/620 |
| 4,996,116 | 2/1991 | Webster et al. | 428/627 |
| 5,463,247 | 10/1995 | Futatsuka et al. | 257/666 |
| 5,510,197 | 4/1996 | Takahashi et al. | 428/670 |

*Primary Examiner*—Jerome Jackson, Jr.
*Assistant Examiner*—Allan R. Wilson
*Attorney, Agent, or Firm*—Koda and Androlia

[57] ABSTRACT

The present invention relates to a lead frame for the formation of a frame structure of an integrated circuit, more particularly, to a lead frame, for a semiconductor device, having a structure possessing excellent bondability, solder wettability, and Ag paste adhesion. A lead frame for a semiconductor device comprises a lead frame substrate; a first intermediate layer, of a Ni plating or a Ni alloy plating, provided on the lead frame substrate; a second intermediate layer, of a Ag plating or a Ag alloy plating, provided on the first intermediate layer; and an outermost layer, of a Pd plating or a Pd alloy plating, provided on the second intermediate layer, wherein the Ag alloy constituting the second intermediat layer is at least one alloy selected from Ag-Co, Ag-Fe, Ag-Pd, Ag-Au, and Ag-Pt.

5 Claims, 2 Drawing Sheets

1

LEAD FRAME FOR SEMICONDUCTOR DEVICE

BACKGROUND OF THE INVENTION

The present invention relates to a lead frame for the formation of a frame structure of an integrated circuit. More particularly, the present invention relates to a lead frame, for a semiconductor device, having a structure possessing excellent bondability, solder wettability, and Ag paste adhesion.

In the case of conventional lead frames, for an integrated circuit, comprising a conductive substrate constituted by a chip mount section, a wire bonding section, and an external lead section, in general, the surface of the chip mount section and the wire bonding section are plated with silver (Ag) or gold (Au), while the external lead section comprises tin (Sn) or a Sn alloy plating. For these lead frames, the use of a plating mask is necessary. This renders the production process complicate, increasing the production cost.

In a further conventional lead frame, the whole surface thereof has a nickel (Ni) plating as an intermediate layer and a Pd plating as the outermost layer (Japanese Patent Publication No. 49382/1988). This lead frame is disadvantageous in that, upon heat treatment, Pd in the surface layer is oxidized, or Ni in the intermediate layer is diffused into the Pd plating as the outermost layer to form an oxide of Ni on the surface thereof, resulting in deteriorated wire bondability and solder wettability.

In a still further conventional lead frame, palladium (Pd) or a Pd alloy coating is formed on the whole surface of a lead frame substrate, and the coating is plated with Ag or Au (Japanese Patent Laid-Open No. 115558/1992). This method has problems including that, in the case of Au (a noble metal) plating, the noble metal Au increases the cost, while in the case of Ag plating, sulfiding occurs resulting in deteriorated properties.

Further conventional lead frames include a lead frame, plated with a palladium-bismuth alloy, proposed by the present inventors (Japanese Patent Laid-Open No. 120394/1994). This lead frame has excellent bondability, solder wettability, Ag paste adhesion, and adhesion of molding resin. In this lead frame, the outermost surface layer portion of the internal lead section, the wire bonding section, and the external lead section has a 0.01 to 10 μm-thick Pd-Bi alloy layer having a bismuth (Bi) content of not more than 10%. Even in this lead frame, there is still room for improvement.

SUMMARY OF THE INVENTION

An object of the present invention is to provide a lead frame, for a semiconductor device, having better bondability, solder wettability, and Ag paste adhesion than the conventional lead frames.

The lead frame for a semiconductor device according to the present invention comprises: a lead frame substrate; a first intermediate layer, of a Ni plating or a Ni alloy plating, provided on the lead flame substrate; a second intermediate layer, of a Ag plating or a Ag alloy plating, provided on the first intermediate layer; and an outermost layer, of a Pd plating or a Pd alloy plating, provided on the second intermediate layer.

According to one embodiment of the present invention, the first intermediate layer has a thickness of 0.01 to 10 μm, the second intermediate layer has a thickness of 0.005 to 10 μm, and the outermost layer has a thickness of 0.005 to 10 μm.

According to the present invention, a lead frame having better bondability, solder wettability, and Ag paste adhesion than the conventional lead frames can be provided, and, at the same time, can realize a more efficient production process, enabling a cost-effective and highly reliable product to be provided.

DETAILED DESCRIPTION OF THE INVENTION

A lead frame is a frame structure supporting leads of ICs, LSIs, discrete semiconductor or the like and basically compresses a pad section for mounting IC chips, an inner lead section for wire bonding and an outer lead section for soldering to a printed wiring board.

Selective conditions for basic properties of lead frame materials are strength, suitability for punching, suitability for etching and the like. Secondary properties required of the lead frame material include chemical properties, suitability for plating, suitability for bonding, and suitability for soldering and silver brazing.

The present inventors have been engaged for many years in the research and development of lead frames having excellent bondability, solder wettability, and chip adhesion and have conducted many experiments. As a result, they have found the following matters.

(1) The second intermediate layer formed of Ag or a Ag alloy can inhibit the thermal diffusion of Ni constituting the first intermediate layer.

(2) Ag or a Ag alloy constituting the second intermediate layer is diffused into Pd or the Pd alloy constituting the outermost layer to prevent the oxidation of Pd.

The present invention has been made based on these findings, and the findings have led to the completion of the present invention.

The present invention will be described in more detail.

Figure 1:
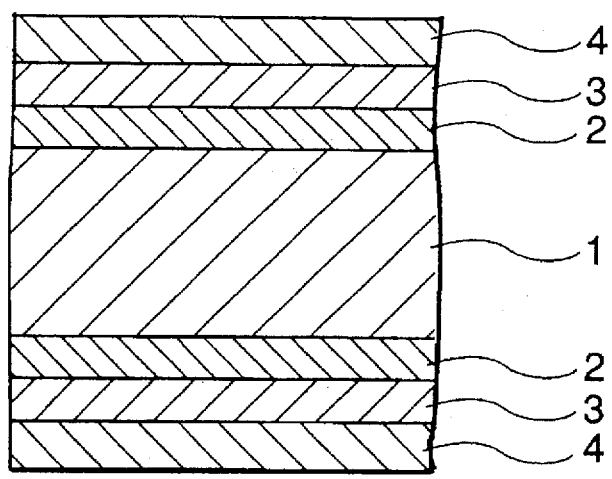
FIG. 1 is an enlarged, explanatory, sectional view of a part of the structure of a lead frame according to one embodiment of the present invention, wherein numeral 1 designates a lead frame material, numeral 2 a first intermediate layer, numeral 3 a second intermediate layer, and numeral 4 an outermost layer.

The present invention provides a lead frame, for a semiconductor device, as shown in FIG. 1, comprising: a lead frame substrate; a first intermediate layer, of a Ni plating or a Ni alloy plating, provided on the lead flame substrate; a second intermediate layer, of a Ag plating or a Ag alloy plating, provided on the first intermediate layer; and an outermost layer, of a Pd plating or a Pd alloy plating, provided on the second intermediate layer.

In the present invention, copper, copper alloys, iron, and iron alloys may be used as the lead frame substrate.

In the present invention, the first intermediate layer, the second intermediate layer, and the outermost layer are successively formed by plating on the whole surface or a necessary area(s) of the lead frame substrate. Each plating may be provided by any of electroplating, electroless plating, and vapor deposition.

The first intermediate layer is provided on the surface of the lead frame substrate and formed of a Ni plating or a Ni alloy plating, and the thickness thereof is preferably in the range of from 0.01 to 10 μm.

The second intermediate layer is an important layer provided for inhibiting the diffusion of the Ni or Ni alloy plating constituting the first intermediate layer, upon heat treatment, into the outermost layer, and the provision of this layer can prevent the deterioration of the wire bondability and solder wettability of the lead frame. The second intermediate layer is formed of a Ag or Ag alloy plating, and a thickness thereof in the range of from 0.005 to 10 μm is suitable for the second intermediate layer. When the thickness is less than 0.005 μm, the number of pinholes is increased making it impossible for the second intermediate layer to function as a thermal diffusion barrier layer, while the upper limit of the thickness is 10 μm for reasons of economy. Ag alloys usable herein include silver-cobalt (Ag-Co), silver-iron (Ag-Fe), silver-palladium (Ag-Pd), silver-gold (Ag-Au), and silver-platinum (Ag-Pt) alloys. The Ag content of the Ag alloy is preferably not less than 90% by weight from the viewpoint of usefulness.

The outermost layer is formed of a Pd or Pd alloy plating, and the thickness thereof is suitably in the range of from 0.005 to 10 μm. When the thickness is less than 0.005 μm, the wire bondability is deteriorated. The upper limit of the thickness is 10 μm for reasons of economy. Pd alloys usable herein include Pd-Au and Pd-Ag alloys having a Pd content of not less than 60% and Pd-Bi, Pd-Pb, palladium-bismuth (Pd-Bi), palladium-lead (Pd-Pb), palladium-iodine (Pd-I), palladium-bromine (Pd-Br), palladium-tin (Pd-Sn), and palladium-iron (Pd-Fe) alloys having a Pd content of not less than 95%.

The lead frame of the present invention, after plating, may be used, as such, as a lead frame for a semiconductor, or alternatively may be heat-treated for thermal diffusion and then used as a lead frame for a semiconductor.

The present invention will be described in more detail with reference to the following examples and comparative examples.

EXAMPLE 1

The surface of a lead frame made of a copper alloy substrate was degreased and activated by a conventional method. The whole surface of the lead frame was plated with Ni to form a 1 μm-thick Ni layer as a first intermediate layer, a 0.05 μm-thick Ag plating was provided thereon as a second intermediate layer, and a 0.1 μm-thick Pd plating was provided thereon as an uppermost layer, thereby preparing a lead frame.

Temperesist AGR and Pallabright SST, commercially available plating solutions manufactured by Japan Pure Chemical Co., Ltd., were used respectively for Ag plating and Pd plating.

The lead frame thus obtained was heat-treated under the following different conditions (1) to (3) and used in tests for the evaluation of bondability and solder wettability.

Heat treatment (1): heating and holding at 150° C. for 2 hr followed by heating at 300° C. for 2 min.

Heat treatment (2): heating and holding at 150° C. for 2 hr followed by heating at 350° C. for 2 min.

Heat treatment (3): heating and holding at 150° C. for 2 hr followed by heating at 400° C. for 2 min.

The evaluation tests were conducted by the following methods.

Test for Evaluation of Bondability

After heat treatment at 330° C. for 60 sec, wire bonding was conducted using a gold wire having a diameter of 25 μm under load 80 g and temperature 180° C. while applying ultrasonic energy under conditions of 700 mW (milliwatt) and 65 mS (millisecond), and the tensile strength was measured with a peel gage.

Test for Evaluation of Solder Wettability

Regarding soldering conditions, the lead frame was dip-coated with rosin-based nonactivation type R-100 flux manufactured by α Metal and immersed in 63%Sn-37%Pb solder bath of 230°±1° C., and the zero-cross time was measured with a meniscograph tester.

The results of each evaluation test are tabulated in Table 1. In the evaluation, A is good, B somewhat good, C somewhat poor, and D poor.

EXAMPLE 2

The surface of a lead frame made of a copper alloy substrate was degreased and activated by a conventional method. The whole surface of the lead frame was plated with Ni to form a 1 μm-thick Ni layer as a first intermediate layer, a 0.1 μm-thick 90%Ag-10%Pd alloy plating was provided thereon as a second intermediate layer, and a 0.1 μm-thick 60%Pd-40%Au alloy plating was provided thereon as an uppermost layer, thereby preparing a lead frame.

Temperesist AGP and Pallabright WGP, commercially available plating solutions manufactured by Japan Pure Chemical Co., Ltd., were used respectively for Ag-Pd alloy plating and Pd-Au alloy plating.

The lead frame thus obtained was heat-treated under the same three conditions as used in Example 1 and tested for the evaluation of the bondability and the solder wettability, and the results of the evaluation are also summarized in Table 1.

EXAMPLE 3

The surface of a lead frame made of a copper alloy substrate was degreased and activated by a conventional method. The whole surface of the lead frame was plated with Ni-Sn to form a 1 μm-thick Ni-Sn layer as a first intermediate layer, a 0.05 μm-thick Ag plating was provided thereon as a second intermediate layer, and a 0.1 μm-thick Pd plating was provided thereon as an uppermost layer, thereby preparing a lead frame.

Temperesist AGR and Pallabright SST, commercially available plating solutions manufactured by Japan Pure Chemical Co., Ltd., were used respectively for Ag plating and Pd plating.

The lead frame thus obtained was heat-treated under the same three conditions as used in Example 1 and tested for the evaluation of the bondability and the solder wettability, and the results of each evaluation test are also summarized in Table 1.

EXAMPLE 4

The surface of a lead frame made of a copper alloy substrate was degreased and activated by a conventional method. The whole surface of the lead frame was plated with Ni-Sn to form a 1 μm-thick Ni-Sn layer as a first intermediate layer, a 0.1 μm-thick Ag-Fe plating was provided thereon as a second intermediate layer, and a 0.1 μm-thick Pd-1%I plating was provided thereon as an uppermost layer, thereby preparing a lead frame.

Temperesist AGF and Pallabright SST-I, commercially available plating solutions manufactured by Japan Pure Chemical Co., Ltd., were used respectively for Ag-Fe alloy plating and Pd-I alloy plating.

The lead frame thus obtained was heat-treated under the same three conditions as used in Example 1 and evaluated for the bondability and the solder wettability, and the results of each evaluation test are also summarized in Table 1.

Comparative Examples 1 to 4

Lead frames were prepared in the same manner as in Examples 1 to 4, except that, after the surface of a lead frame made of a copper alloy substrate was degreased and activated by a conventional method, the provision of the second intermediate layers in Examples 1 to 4 was omitted.

The lead frames thus obtained were tested for the evaluation of the bondability and the solder wettability. The results of each evaluation test are also summarized in Table 1.

TABLE 2

| Element | Energy (eV) | Quantitative determination (%) |
| --- | --- | --- |
| Pd | 330.0 | 41.29 |
| Ag | 351.0 | 50.17 |
| O | 512.0 | 8.54 |

TABLE 3

| Element | Energy (eV) | Quantitative determination (%) |
| --- | --- | --- |
| Pd | 330.0 | 30.30 |
| O | 512.0 | 49.74 |
| Ni | 847.0 | 19.96 |

TABLE 1

| | Laminate structure | | | Evaluation test on bondability | | | | | | Evaluation test on plate bond strength Zero-cross time (sec) | | | | | |
| | | | | Peel strength in wire bonding (g) | | | | | | Heat treatment | | Heat treatment | | Heat treatment | |
| Ex. | 1st intermediate layer | 2nd intermediate layer | Outermost layer | Heat treatment 1 | Evaluation | Heat treatment 2 | Evaluation | Heat treatment 3 | Evaluation | 1 Heat treatment 1 | Evaluation | 2 Heat treatment 2 | Evaluation | 2 Heat treatment 3 | Evaluation |
| EX. 1 | Ni | Ag | Pd | 10.0 | A | 9.5 | A | 9.4 | A | 0.2 | A | 0.2 | A | 0.2 | A |
| EX. 2 | Ni | Ag—Pg | Pd—Au | 10.7 | A | 10.6 | A | 10.1 | A | 0.2 | A | 0.2 | A | 0.2 | A |
| EX. 3 | Ni—Sn | Ag | Pd | 10.6 | A | 9.8 | A | 9.6 | A | 0.2 | A | 0.2 | A | 0.3 | A |
| EX. 4 | Ni—Sn | Ag—Fe | Pd—I | 11.0 | A | 10.8 | A | 10.5 | A | 0.2 | A | 0.2 | A | 0.4 | A |
| Comp. EX. 1 | Ni | None | Pd | 6.9 | C | 4.2 | C | Wire bonding is impossible | D | Not wettable | D | Not wettable | D | Not wettable | D |
| Comp. EX. 2 | Ni | " | Pd—Au | 7.7 | B | 6.5 | C | Wire bonding is impossible | D | 2.0 | B | 3.5 | C | Not wettable | D |
| Comp. EX. 3 | Ni—Sn | " | Pd | 7.4 | B | 4.4 | C | Wire bonding is impossible | D | 4.5 | C | Not wettable | D | Not wettable | D |
| Comp. EX. 4 | No—Sn | " | Pd—I | 7.0 | B | 3.9 | C | Wire bonding is impossible | D | 2.5 | B | Not wettable | D | Not wettable | D |

EXAMPLE 5

Figure 2:
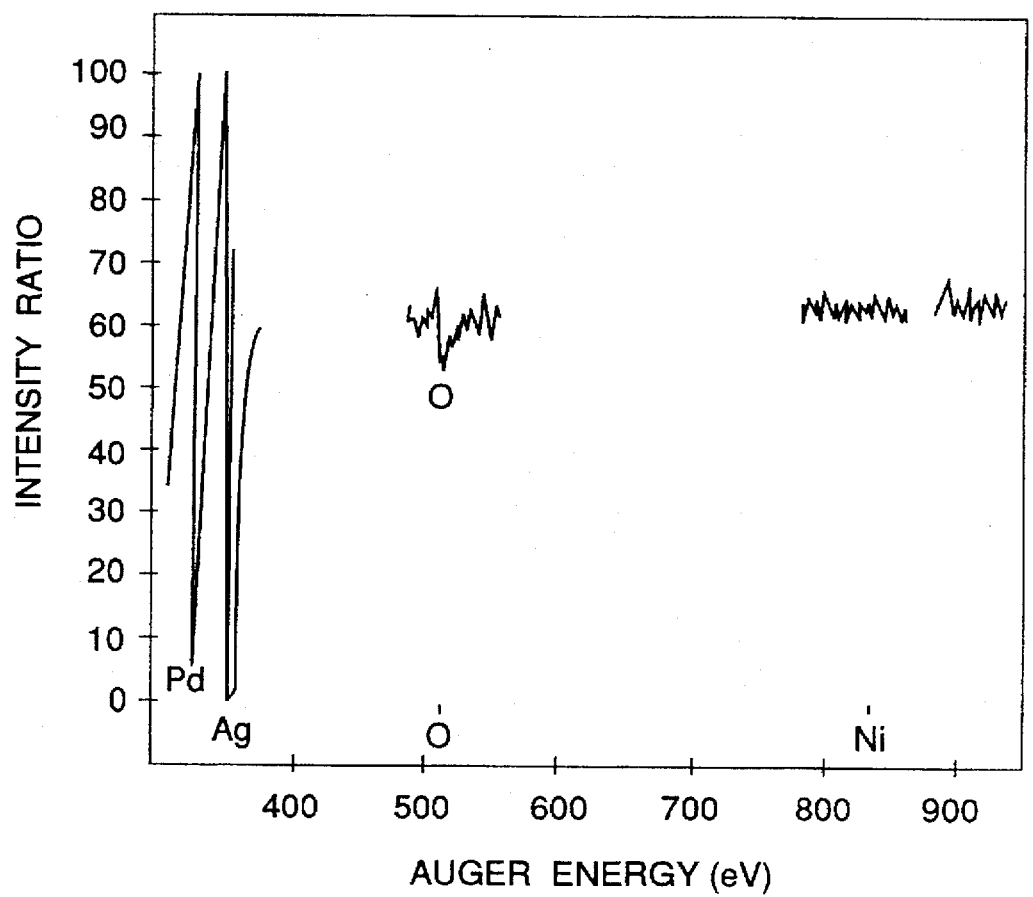
FIG. 2 is a graph showing the results of Auger electron spectroscopy for the outermost layer of a product which has been heat-treated at 500° C. for 1 min in Example 1 of the present invention.
Figure 3:
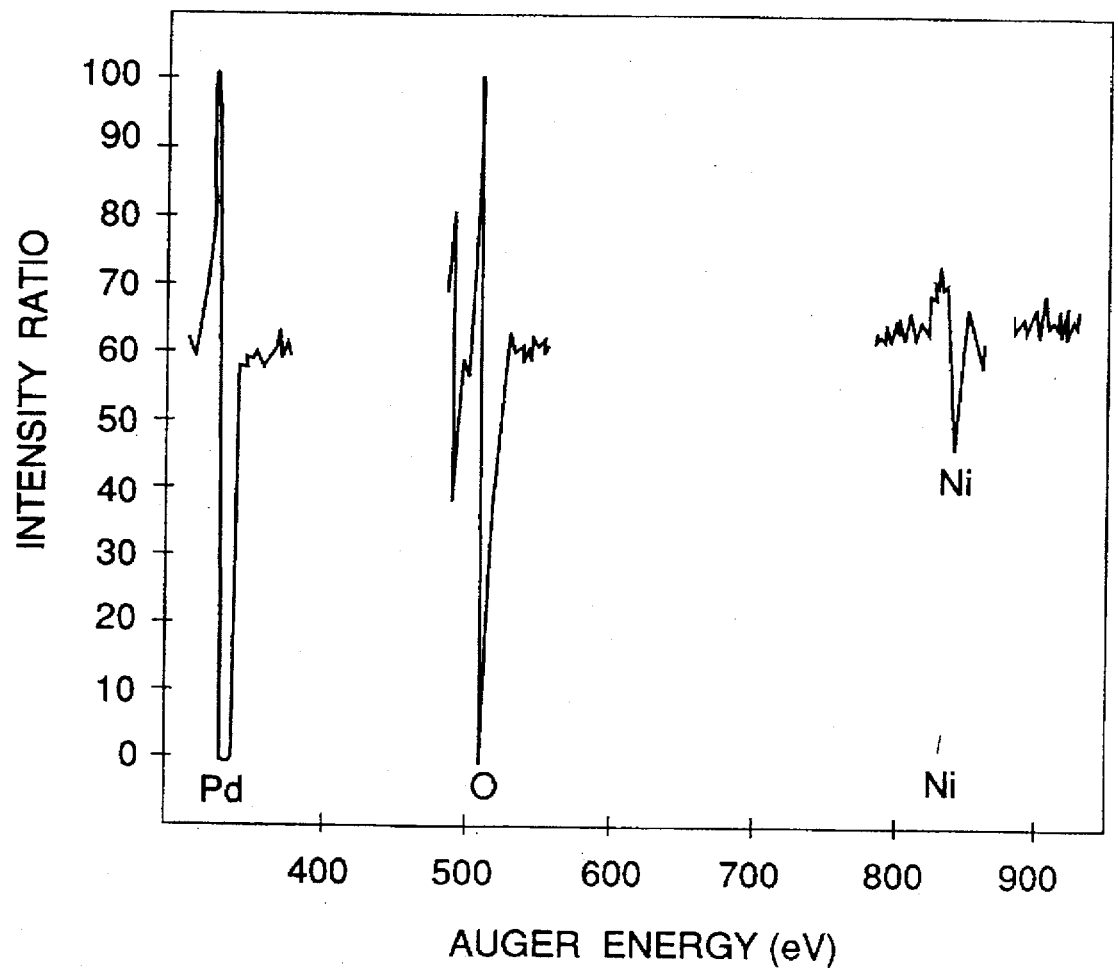
FIG. 3 is a graph showing the results of Auger electron spectroscopy for the outermost layer of a product which has been heat-treated at 500° C. for one min in Comparative Example 1.

The outermost surface layer of samples prepared by heat-treating the lead frames, prepared in Example 1 and Comparative Example 1 (with no second intermediate layer being provided), at 500° C. for one min were analyzed by Auger electron spectroscopy. The analytical results are shown in FIGS. 2 and 3. Further, the results tabulated in Tables 2 and 3 were obtained from the data, provided by Auger electron spectroscopy, shown in FIGS. 2 and 3.

These results have revealed that no diffusion of Ni was observed for the lead frame of the present invention, and, at the same time, the amount of oxygen detected was very small, whereas, for the comparative lead frame, Ni derived from the diffusion was detected and, at the same time, a large amount of oxygen was detected.

What is claimed is:

1. A lead frame for a semiconductor device, comprising: a lead frame substrate; a first intermediate layer, of a nickel (Ni) plating or a nickel (Ni) alloy plating having a thickness of 0.01–10 μm, provided on the lead frame substrate; a second intermediate layer, of a silver (Ag) plating or a silver (Ag) alloy plating having a thickness of 0.005–10 μm, provided on the first intermediate layer; and an outermost layer, of a palladium (Pd) plating or a palladium (Pd) alloy plating having a thickness of 0.005–10 μm, provided on the second intermediate layer.

2. The lead frame according to claim 1, wherein the Ag alloy constituting the second intermediate layer is at least one alloy selected from the group consisting of Ag-Co Ag-Fe, Ag-Pd, Ag-Au and Ag-Pt.

3. The lead frame according to claim 2, wherein the Ag alloy constituting the second intermediate layer is an alloy having a Ag content of not less than 90% by weight.

4. The lead frame according to claim 1, wherein the Pd alloy constituting the outermost layer is a Pd-Au or Pd-Ag alloy having a Pd content of not less than 60% by weight.

5. The lead frame according to claim 1, wherein the Pd alloy constituting the outermost layer is at least one alloy selected from the group consisting of Pd-Bi, Pd-Pb, Pd-I, Pd-Br, Pd-Sn, and Pd-Fe, said Pd alloys having a Pd content of not less than 95% by weight.

* * * * *